United States Patent [19]

Yamane et al.

[11] Patent Number: 4,965,797
[45] Date of Patent: Oct. 23, 1990

[54] PARALLEL-TO-SERIAL CONVERTER

[75] Inventors: Kazuo Yamane; Masanori Shimasue, both of Kawasaki, Japan

[73] Assignee: Fujitsu Limited, Kawasaki, Japan

[21] Appl. No.: 367,263

[22] Filed: Jun. 16, 1989

[30] Foreign Application Priority Data

Jun. 16, 1988 [JP] Japan ................................ 63-148662

[51] Int. Cl.[5] ................................................ H04J 3/02
[52] U.S. Cl. ...................................... 370/112; 375/118; 328/104
[58] Field of Search ................... 370/112, 77; 328/104, 328/105; 307/243, 244; 375/110, 118

[56] References Cited

U.S. PATENT DOCUMENTS

4,759,018 7/1988 Buchner ............................ 370/112
4,791,488 12/1988 Fukazawa et al. ................. 375/118
4,837,763 6/1989 Sasaki ................................ 328/104

Primary Examiner—Douglas W. Olms
Assistant Examiner—Min Jung
Attorney, Agent, or Firm—Staas & Halsey

[57] ABSTRACT

A parallel-to-serial converter multiplexes parallel input data into a serial output data. This converter includes a multiplier for multiplying an input clock corresponding to a parallel input data, a divider for dividing the multiplied clock, and a waveform shaping circuit for shaping a serial output data by the multiplied clock. The converter multiplexes parallel data at a center of each phase thereof based on the divided clock by adjusting phases between the input data (or the input clock) and the divided clock to be in a predetermined relationship.

6 Claims, 7 Drawing Sheets

(a) INPUT DATA D1
(b) DIVIDED CLOCK ø(2)1
(c) MULTIPLEXED DATA MD1
(d) MULTIPLE CLOCK ø(1)
(e) MULTIPLEXED DATA MD2

PARALLEL-TO-SERIAL CONVERTER

BACKGROUND OF THE INVENTION

This invention relates to a parallel-toserial converter, and more specifically, to a parallel-to-serial converter for multiplexing a plurality of parallel input data into a serial data.

Recently, transmission apparatus with high speed operation has been achieved. The current transmission rate in such an optical communication system has reached the order of gigabit/second.

To obtain such a high speed transmission rate, it is conventional practice to use multiplex techniques. Since a parallel-to-serial conversion is considered a simple method of multiplexing, a parallel-to-serial converter is often used for a multiplexer operated under high speed.

Moreover, it has also been known to employ a synchronous multiplexing network, such as Integrated Services for Digital Network ("ISDN") and Synchronous Optical Network ("SONET"), to easily connect the communication systems. The basic transmission rate is selected to several tens of megabit/second and a multiplexing pulse code modulation ("PCM") hierarchy is set to an integer multiple of this basic transmission rate.

In this synchronous multiplexing system, each network and each transmission line are synchronized with each other in order to easily connect one network to another and to form a simple and less costly multiplexer by parallel-toserial conversion.

Therefore, a parallel-to-serial converter is now frequently employed for a multiplexer to realize a stable high speed data transmission yet less costly system.

As transmission speed has increased, however, converting a plurality of parallel input data into a serial data adversely reduces the phase margin in the parallel-to-serial converter, in view of a phase relation between a clock signal deciding an output timing of each of the parallel input data and the parallel input data themselves. Accordingly, in such a high speed operation, a rising time and falling time of a waveform of an input data, and a set up time and holding time of circuit elements in a parallel-to-serial converter cannot be neglected so that the phase margin of input data is occupied by the above rising and falling time and the set up and holding time.

When the phase margin becomes reduced, it is difficult to realize a stable operation and a higher speed operation of a parallel-to-serial converter.

SUMMARY OF THE INVENTION:

Therefore, it is an object of the present invention to improve the phase margin of a parallel-to-serial converter.

It is a further object of the present invention to realize a stable and higher speed operative parallel-to-serial converter.

Additional objects and advantages of the invention will be set forth in part of the description which follows, and in part will be obvious from the description, or may be learned by practice of the invention. The objects and advantages of the invention may be realized and obtained by means of the instrumentalities and combination particularly pointed out in the claims.

To achieve the foregoing objects and in accordance with the purpose of the invention, as embodied and broadly described herein, a parallel-to-serial converter for multiplexing a plurality of parallel input data into a serial data, comprises: (1) means for multiplying an input clock corresponding to the parallel input data and generating a multiple clock corresponding to serial data; (2) means for dividing the multiple clock from the multiplying means and generating a divided clock corresponding to the parallel input-data; (3) means for converting the parallel input-data into the serial data in accordance with the divided clock from the dividing means; (4) means for shaping a waveform of the serial data output from the converting means using the multiple clock from the multiplying means and outputting a multiplexed data; (5) means for comparing a phase relationship between the divided clock and the parallel input data(or the input clock); and (6) means for adjusting a phase relationship between the parallel input data (or the input clock) and the divided clock in accordance with the comparing means.

BRIEF DESCRIPTION OF THE DRAWINGS

The accompanying drawings, which are incorporated in and constitute a part of this specification, illustrate embodiments of the invention and, together with the description, serve to explain the principles of the invention.

FIG. 8is another circuit diagram for the parallel-to-serial converter of FIG. 3;

DETAILED DESCRIPTION OF THE PREFERRED EMBODIMENTS

Before describing the present invention, the prior art parallel-to-serial converter will be described and then the reason for and method of improving a phase margin will be explained.

Figure 1:
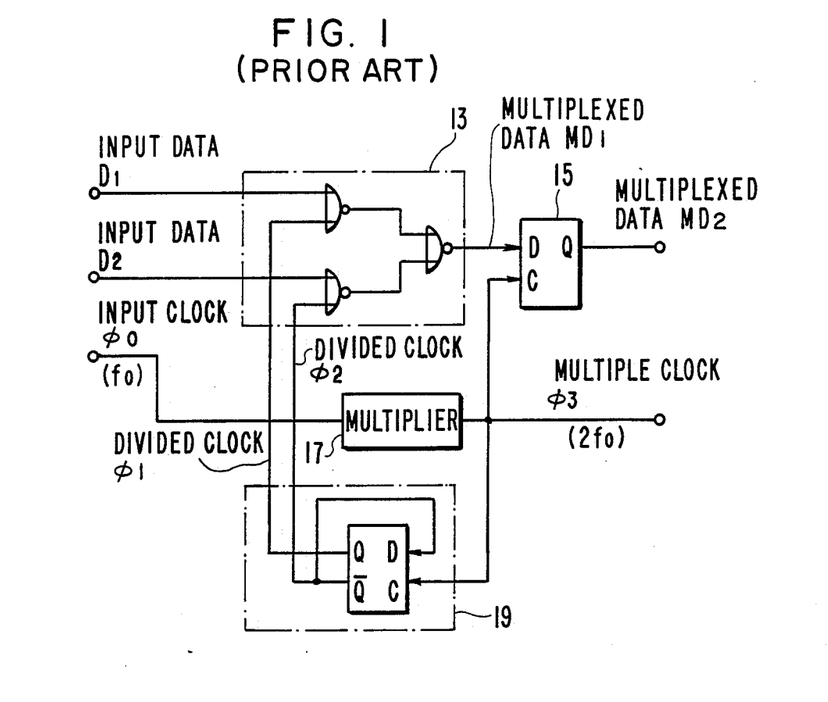
FIG. 1 is a circuit diagram of the prior art parallel-to-serial converter.

FIG. 1 is a circuit diagram of the prior art parallel-to-serial converter. In FIG. 1, a multiplexing circuit 13 receives a pair of input data $D_1$, $D_2$ for parallel-to-serial conversion and outputs a serial multiplex data $MD_1$. These input data $D_1$, $D_2$ are synchronizing with each other. An input clock $\phi 0$ is also synchronizing with these input data $D_1$, $D_2$. A flip-flop circuit 15 is provided at the output of multiplexing circuit 13 for discriminating and shaping multiplex data $MD_1$ and for outputting a multiplexed data $MD_2$. A multiplier 17, connected to input clock $\phi_0$, outputs multiple clock $\phi_3$ by multiplying two times a frequency of the input clock $\phi_0$. A dividing circuit 19 divides a frequency of multiple clock $\phi_3$ into ½ and generates a couple of divided clocks $\phi_1$ and $\phi_2$ having reverse polarities respectively.

The multiplexing circuit 13 has three NOR circuits to convert the input data $D_1$, $D_2$ into serial multiplex data $MD_1$ by alternately selecting such input data with the phase of frequency divided clocks $\phi_1$, $\phi_2$ input from the dividing circuit 19. Namely, the input data $D_1$, $D_2$ are read out one-by-one when the divided clocks $\phi_1$, $\phi_2$ are in the "L" or "0" level and either this read out input data $D_1$ or $D_2$ is output as the multiplex data $MD_1$. The multiplex data $MD_1$ is then input to the flip-flop circuit 15, discriminated "0" or "1", and shaped therein by the multiple clock $\phi_3$ from the multiplier 17 through reformation. This is then the output as the multiplex data $MD_2$.

Figure 2:
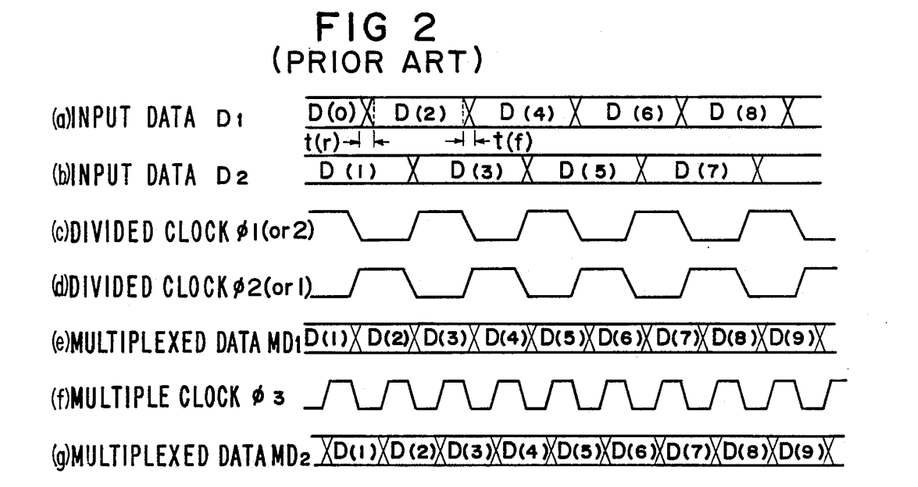
FIG. 2 is a timing chart illustrating signal waveforms at respective points of the circuit diagram of FIG. 1 for explaining the operation of the prior are converter of FIG. 1.

A time chart of respective signals in the prior art parallel-to-serial converter of FIG. 1 is shown in FIG. 2. Operation of this parallel-to-serial converter will be further explained with reference to FIG. 2.

As shown in FIG. 2, the input data $D_1$, $D_2$ are mutually shifted in the phase by $\pi$ (radian) to keep the sequence between the two input data $D_1$, $D_2$. Phase relations of the input data $D_1$, $D_2$ and input clock $\phi 0$ are previously adjusted by the phase adjusting circuit not illustrated so that they are in a constant phase relation.

The multiplexing circuit 13 selects the parallel input data $D_1$, $D_2$ in the timing of divided clocks $\phi 1$, $\phi 2$ to convert these parallel data into the series data as the time series multiplex data $MD_1$. Namely, the multiplexing circuit 13 selects and outputs the input data $D_1$ when the divided clock $\phi_1$ is in the "0" or "L" level and the input data $D_2$ when the divided clock $\phi_2$ is in the "0" or "L" level.

This multiplex data $MD_1$ is discriminated "0" or "1" and shaped by the flip-flop 15 in the rise timing of the clock $\phi_3$ and is then output as the multiplex data $MD_2$ in the defined phase and time interval.

In this prior art parallel-to-serial converter, the multiple clock $\phi_3$ output from the multiplier 17 is divided in the dividing circuit and the divided clocks $\phi$, $\phi_2$ are used as the multiplexing clocks in the multiplexing circuit 13 in order to synchronize the divided clocks $\phi_1$, $\phi_2$ with the multiple clock $\phi_3$.

In the prior art parallel-to-serial converter shown in FIG. 1, the polarity of divided clocks $\phi_1$, $\phi_2$ output from the dividing circuit 19 cannot be defined because of the nature of discrimination flip-flop 15 so that it is possible, for example, that the converter provides the divided clocks $\overline{\phi_1}$, $\overline{\phi_2}$ polarity inverted from divided clocks $\phi_1$, $\phi_2$. Therefore, in case the read timing defined by divided clocks $\phi_1$, $\phi_2$ is set to be located at the center of input data $D_1$, $D_2$ on the occasion of reading the input data $D_1$, $D_2$ by the multiplexing circuit 13, if the polarity of divided clocks $\phi_1$, $\phi_2$ is inverted and the divided clocks $\overline{\phi_1}$, $\overline{\phi_2}$ appears, the data is read at the data converting point of the input data $D_1$, $D_2$ and read error may be generated.

Accordingly, in the prior art parallel-toserial converter, the timing of reading the input data $D_1$, $D_2$ with the divided clocks $\phi_1$, $\phi_2$ is set to the front half or back half position of the input data $D_1$, $D_2$ and thereby read error is no longer generated if the polarity of divided clocks $\phi_1$, $\phi_2$ is converted.

However, using only the front half or back half position of input data $D$, $D_2$ for a read out timing substantially reduces the phase margin to a half. With recent advancement in transmission rates, a high transmission rate system cannot set the rising time t(r) or falling time t(f) of the input data $D_1$, $D_2$ to a sufficiently higher value relative to the transmission rate and also cannot neglect the setup time and hold time of the discrimination flip-flop 15. Accordingly, such a high transmission rate system would significantly reduce the phase margin in the prior art parallel-to-serial converter.

In accordance with the invention, it has been found that the phase margin must be improved by conducting discrimination at the center point of each of the input data in a parallel-to-serial converter. Block diagrams of two preferred embodiments of the present invention are shown in FIG. 3 and FIG. 4.

Figure 3:
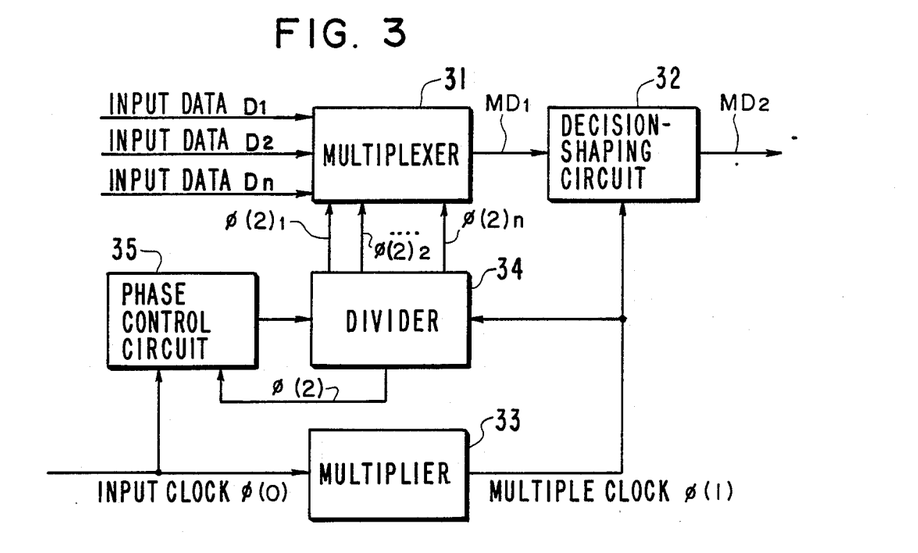
FIG. 3 is a block diagram of an embodiment of a parallel-to-serial converter in accordance with the present invention.

The first preferred embodiment of a parallel-to-serial converter of the present invention is shown in FIG. 3. A multiplier 33 generates a clock $\phi(1)$ having N-multiple frequency of an input clock $\phi(o)$. As used herein, N is an integer which is equal to 2 or larger than 2. A dividing circuit 34 generates N divided clocks $\phi(2)_1 \sim \phi(2)_n$ by dividing the frequency of multiple clock $\phi(1)$ of the multiplier 33 into 1/N. A multiplexing circuit 31 receives in parallel the input data $D_1 \sim D_n$ to be converted into a series data $MD_1$ and multiplexes input data $D_1 \sim D_n$ in accordance with the phase of N divided clocks $\phi(2)_1 \sim \phi(2)_n$ from the dividing circuit 34. As previously described with reference to the converter of FIG. 1, the input data $D_1 \sim D_n$ are synchronizing with each other and the input clock $\phi(0)$ is also synchronizing with these input data $D_1 \sim D_n$. A decision and shaping circuit 32 discriminates "0" or "1" of the multiplex data MD1 received by circuit 32 from the multiplexing circuit 31 and shapes such data MD1 with multiple clock $\phi(1)$ received from the multiplier 33. A phase control circuit 35 compares the phase of the input clock $\phi(0)$ with that of divided clock $\phi(2)$ of the dividing circuit 34 and controls the output phase of divided clock $\phi(2)$ of the dividing circuit 34 so that the divided clock $\phi(2)_1 \sim \phi(2)_n$ synchronizes with the input clock $\phi(0)$.

The above embodiment is based on the concept of controlling a phase of the divided clock $\phi(2)1 \sim \phi(2)_n$ for improving a phase margin. Namely, by controlling a phase of the divided clock $\phi(2)1 \sim \phi(2)_n$, a phase relationship between the parallel input data $D_1 \sim D_n$ and the divided clock $\phi(2)1 \sim \phi(2)_n$ can be adjusted so that a phase of the divided clock is positioned at the center of a phase of the parallel input data $D1 \sim D_n$.

Figure 4:
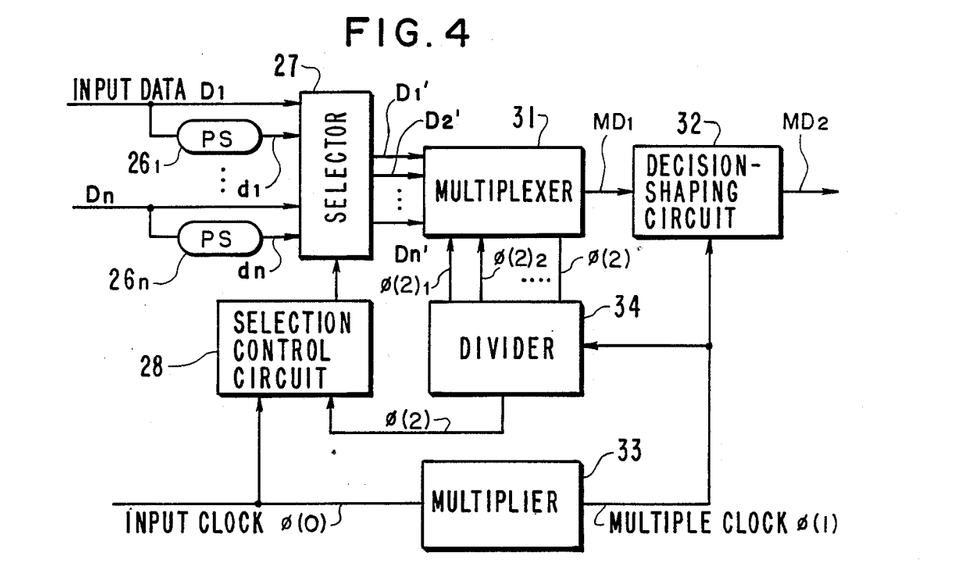
FIG. 4 is a block diagram of another embodiment of a parallel-to-serial converter in accordance with the present invention.

Another preferred embodiment of the parallel-to-serial converter of the present invention is shown in FIG. 4. A multiplier 33 generates a multiple clock $\phi(1)$ from an input clock $\phi(0)$. A dividing circuit 34 generates N divided clocks $\phi(2)_1 \sim \phi(2)_n$ by dividing the frequency of multiple clock $\phi(1)$ from the multiplier 33 into 1/N. A phase shift circuit $26_1 \sim 26_n$ respectively shifts phases of input data $D_1 \sim D_n$ to be converted into $d_1 \sim d_n$ by a predetermined value. A selection circuit 27 selects either input data $D_1 \sim D_n$ or shifted input data $d_1 \sim d_n$. A multiplexing circuit 31 receives in parallel the input data $D'_1 \sim D'_n$ n from the selection circuit 27 and multiplexes $D'_1 \sim D'_n$ into MD1 in accordance with the phase of N divided clock $\phi(2)1 \sim \phi(2)_n$ from the dividing circuit 34.

As was explained with reference to the embodiment of FIG. 3, input data $D_1 \sim D_n$ and input clock $\phi(0)$ are synchronizing with each other. A decision and shaping circuit 32 discriminates "0" or "1" of the multiplex data $MD_1$ from the multiplexing circuit 31 and shapes such multiplex data $MD_1$ with the multiple clock $\phi(1)$. A selection control circuit 28 compares the phase of the divided clock $\phi(2)$ with that of input clock $\phi(0)$ and controls a changeover operation of the selection circuit 27.

This second preferred embodiment is based on the concept of controlling a phase of the input data $D_1 \sim D_n$ instead of the divided clock $\phi(2)_1 \phi(2)_n$ in order to improve a phase margin. Namely, by controlling a phase of the parallel input data $D_1 \sim D_n$, a phase relationship between the parallel input data $D_1 \sim D_n$ and the divided clock $\phi(2)1 \sim \phi(2)_n$ can be adjusted so that a phase of the divided clock is positioned at the center of a phase of the parallel input data $D'1 \sim D'_n$.

Figure 5:
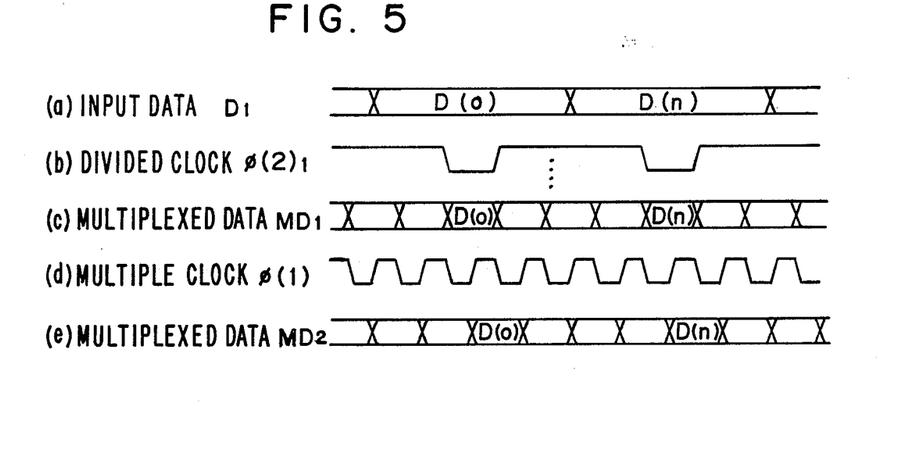
FIG. 5 is a timing chart illustrating signal waveforms at respective points of the parallel-to-serial converter of FIGS. 3 and 4.

A time chart of signals at respective points for the parallel-to-serial converters of FIGS. 3 and 4 is shown in FIG. 5. With respect to the converter of FIG. 3, phase control circuit 35 compares the phases of input clock $\phi(0)$ and divided clock $\phi(2)$ and thereby controls the output phase of the dividing circuit 34 so that data is read out at the center position of the data $D_1 \sim D_n$ to be converted by the divided clocks $\phi(2)1 \sim \phi(2)_n$ in the multiplexing circuit 31.

In the parallel-to-serial converter of FIG. 4, if the phase of data $D_1 \sim D_n$ to be converted and the divided clocks $\phi(2)1 \sim \phi(2)_n$ are mutually deviated in the multiplexing circuit 31, such deviation can be detected by comparing the input clock $\phi(0)$ and the divided clock $\phi(2)$ in the selection control circuit 28 because the input clock $\phi(0)$ is synchronized with data $D_1 \sim D_n$. The changeover operation is carried out in the selection circuit 27 depending on such detection and thereby the data $d_1 \sim d_n$ to be converted which have been shifted a specified amount in the phase shifting circuit $261 \sim 26_n$ are supplied to the multiplexing circuit 31. As a result, the data read out operation is carried out at the center position of data $d_1 \sim d_n$ to be converted by the divided clocks $\phi(2)1 \sim \phi(2)_n$ in the multiplexing circuit 31 and thereby the phase margin can be improved.

Further details and explanation of the embodiments of FIGS. 3 and 4 will now be made with reference to FIGS. 6 to 11.

Figure 6:
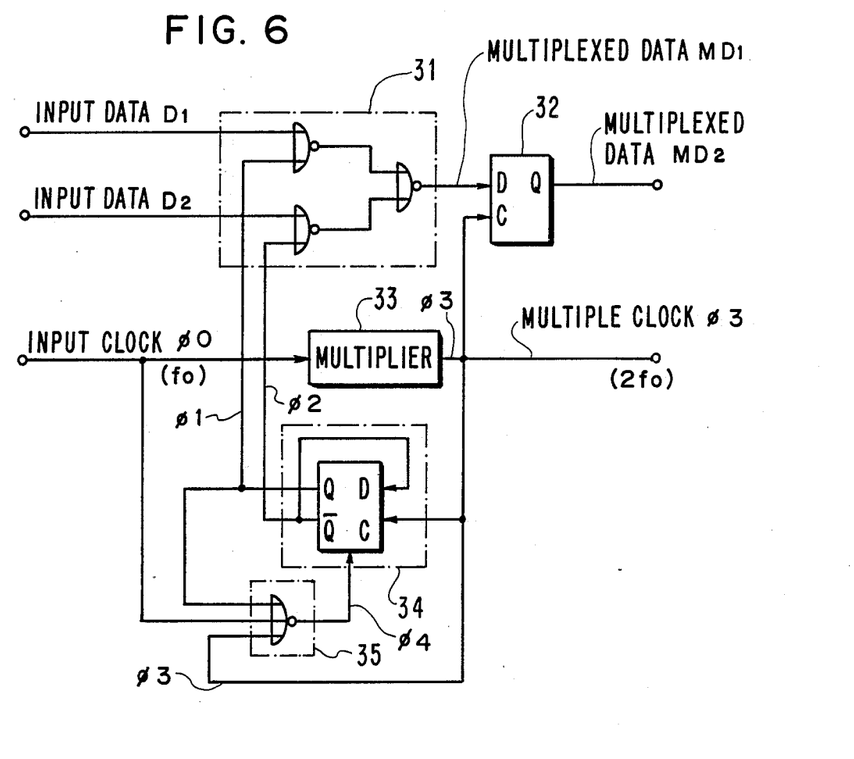
FIG. 6 is a circuit diagram for the parallel-to-serial converter of FIG. 3.

FIG. 6 is a circuit diagram for the parallel-to-serial converter of FIG. 3. This circuit includes a multiplexing circuit 31, a decision-shaping flip-flop 32, a multiplier 33, a dividing circuit 34 and a phase comparison circuit 35. The dividing circuit 34 includes a flip-flop having a set pulse input terminal. When the set pulse is applied to the set pulse input terminal, the polarity of output Q (namely, the divided clock $\phi$1) becomes "H" or "1".

Moreover, the phase comparison circuit 35 includes a NOR circuit with three inputs. The input clock $\phi$0, divided clock $\phi$1 from the dividing circuit 34 and the clock $\phi$3' obtained by delaying the phase of the multiple clock $\phi$3 from the multiplier 33 with the predetermined degree are such three inputs to circuit 35. When the three inputs are all "0" or "L", the set pulse $\phi$4 is output to the set pulse input terminal of the dividing circuit 34.

Figure 7:
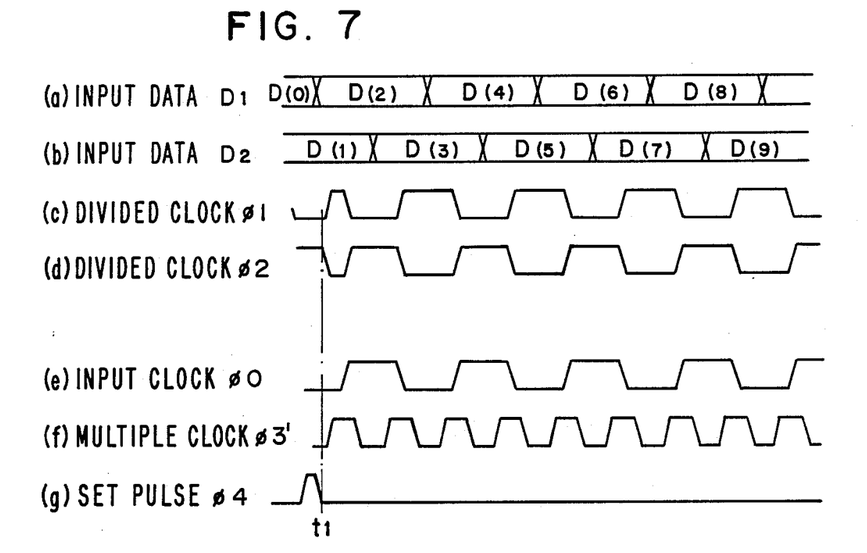
FIG. 7 is a timing chart illustrating signal waveforms at respective points in the circuit diagram of FIG. 6.

Operation of this embodiment is explained by referring to FIG. 7 which is a time chart of signals thereof at respective points of the circuit of FIG. 6. As explained with reference to FIGS. 1, 3 and 4, input data $D_1$, $D_2$ and input clock $\phi$0 are synchronizing with each other.

In this embodiment, when the divided clocks $\phi$1, $\phi$2 are in the "L" level, corresponding NOR circuits are open and the input data D1, D2 are read out from a multiplexing circuit 31 via corresponding NOR circuits. Here, the input clock $\phi$0 has previously been adjusted in its phase so that the "H" level thereof is positioned at the center of input data D1. In this embodiment the phases of divided clocks $\phi$1, $\phi$2 are adjusted with reference to the phase of this clock input $\phi$0.

Namely, the output phase of dividing circuit 34 is adjusted so that the polarities of input clock $\phi$0 and divided clock $\phi$1 have inverted polarities with each other. This polarity inversion can be achieved by outputting the set pulse $\phi$4 to invert the polarities of outputs Q, Q of the dividing circuit 34 when both input clock $\phi$0 and divided clock $\phi$1 are in the "L" level (refer to time $t_1$ in FIG. 7). Thereafter, the input data $D_1$, $D_2$ are thereby read out respectively by the divided clocks $\phi$1, $\phi$2 at the center position of these clocks.

The clock $\phi$3' to be input to the phase comparison circuit 35 is used for narrowing the comparison period so that an erroneous set pulse is no longer output due to the existence of noise at the time of comparing the input clock $\phi_0$ with the divided clock $\phi$1.

Figure 8:
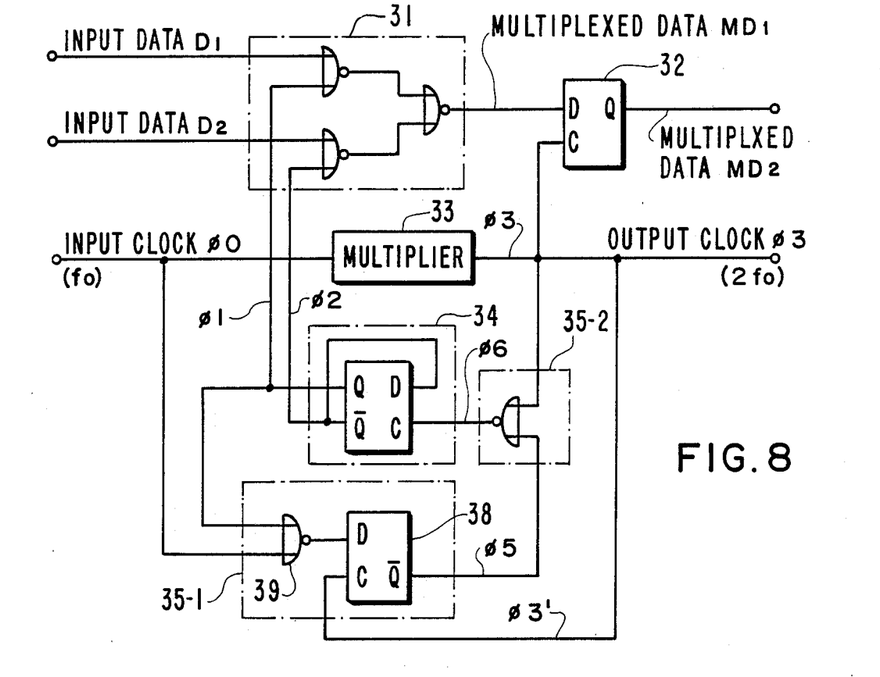

It can be readily seen that the present invention allows for a variety of modifications or changes in circuit design for the converter. For example, FIG. 8 is another alternative circuit diagram for the parallel-to-serial converter embodiment of FIG. 3. In this circuit diagram, the phase adjustment of divided clocks $\phi$1, $\phi$2 is carried out by inhibiting the multiple clock $\phi$3 to be input to the dividing circuit 34.

The circuit of FIG. 8 includes a multiplexing circuit 31, a flip-flop 32 as a decision and shaping circuit, a multiplier 33, a dividing circuit 34, a phase comparison circuit 35-1 and an inhibit circuit 35-2. The functioning of phase comparison circuit 35-1 and inhibit circuit 35-2 correspond to the phase control circuit 35 of FIG. 3. The phase comparison circuit 35-1 has a NOR circuit 39 which receives the input clock $\phi$0 and divided clock $\phi$1 and a flip-flop 38 which receives an output of the NOR circuit 39 at the data input terminal D and the clock $\phi$3' having a predetermined phase delay of the multiple clock $\phi$3 at the clock input terminal C of flip-flop 38. The output pulse $\phi$5 of the flip-flop 38 is output to the inhibit circuit 35-2.

The inhibit circuit 35-2 is formed by a 2-input NOR circuit and receives the input pulse $\phi$5 and multiple clock $\phi$3 respectively and supplies output clock $\phi$6 to the dividing circuit 34.

Figure 9:
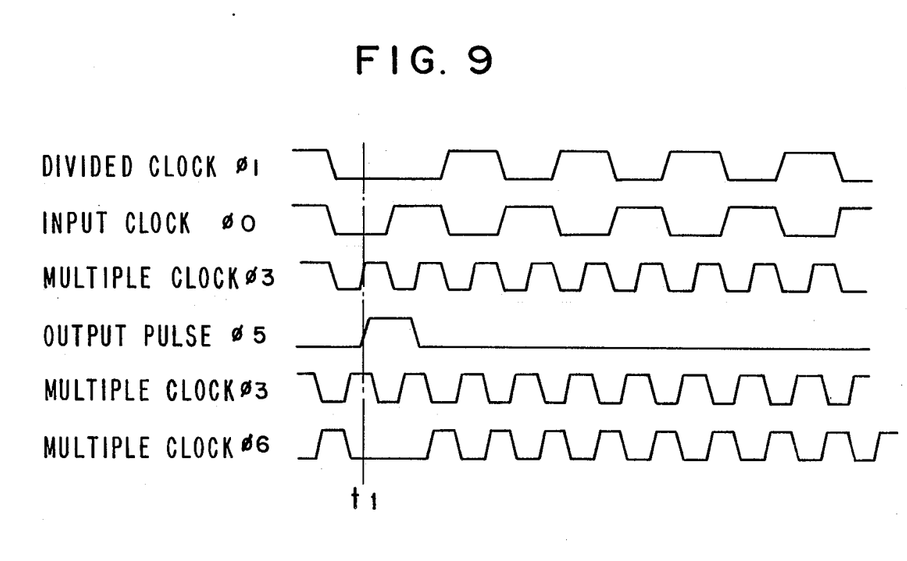
FIG. 9 is a timing chart illustrating signal waveforms at respective points of the circuit diagram of FIG. 8.

Operation of this embodiment will be explained hereunder with reference to FIG. 9. FIG. 9 is a time chart of signals at respective points of the circuit of FIG. 8. In this embodiment, when the polarity of divided clock $\phi$1 is inverted from the normal polarity, it is detected (refer to the time t1 in FIG. 7) in the phase comparison circuit 35-1 from the fact that both input clock $\phi_0$ and divided clock $\phi_1$ are in the "0" or "L" level at the rising edge of the clock $\phi$3'. Thereby the output pulse $\phi_5$ is sent to the inhibit circuit 35-2 and one pulse of the multiple clock $\phi$3 inhibited by this inhibit circuit 35-2 is extracted and then supplied to the dividing circuit 34 as the clock $\phi_6$.

Accordingly, the polarities of divided clocks $\phi$1, $\phi$2 output from the dividing circuit 34 are inverted and thereafter the input data D1, D2 are read out at the center position by the divided clocks $\phi$1, $\phi$2.

Figure 10:
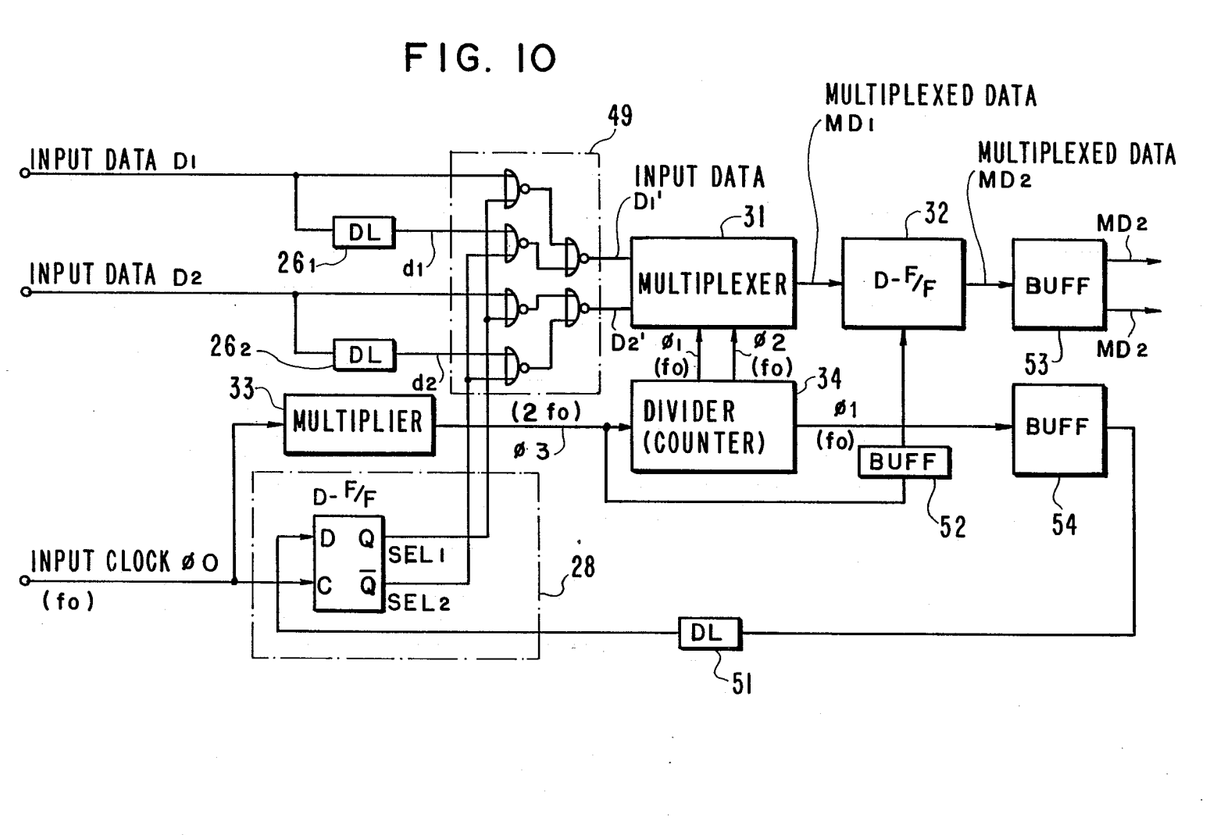
FIG. 10 is a circuit diagram for the parallel-to-serial converter of FIG. 4.

A circuit diagram for the converter embodiment of FIG. 4 is shown in FIG. 10. In this circuit diagram for the converter of FIG. 4, the phases of input data D1, D2 are shifted by (radian) (instead of the FIG. 3 converter where the polarities of divided clocks $\phi_1$, $\phi_2$ are inverted) when the phases of divided clocks $\phi_1$, $\phi_2$ for reading out the input data $D_1$, $D_2$ are inverted with respect to the phase of the input clock $\phi_0$.

Figure 11:
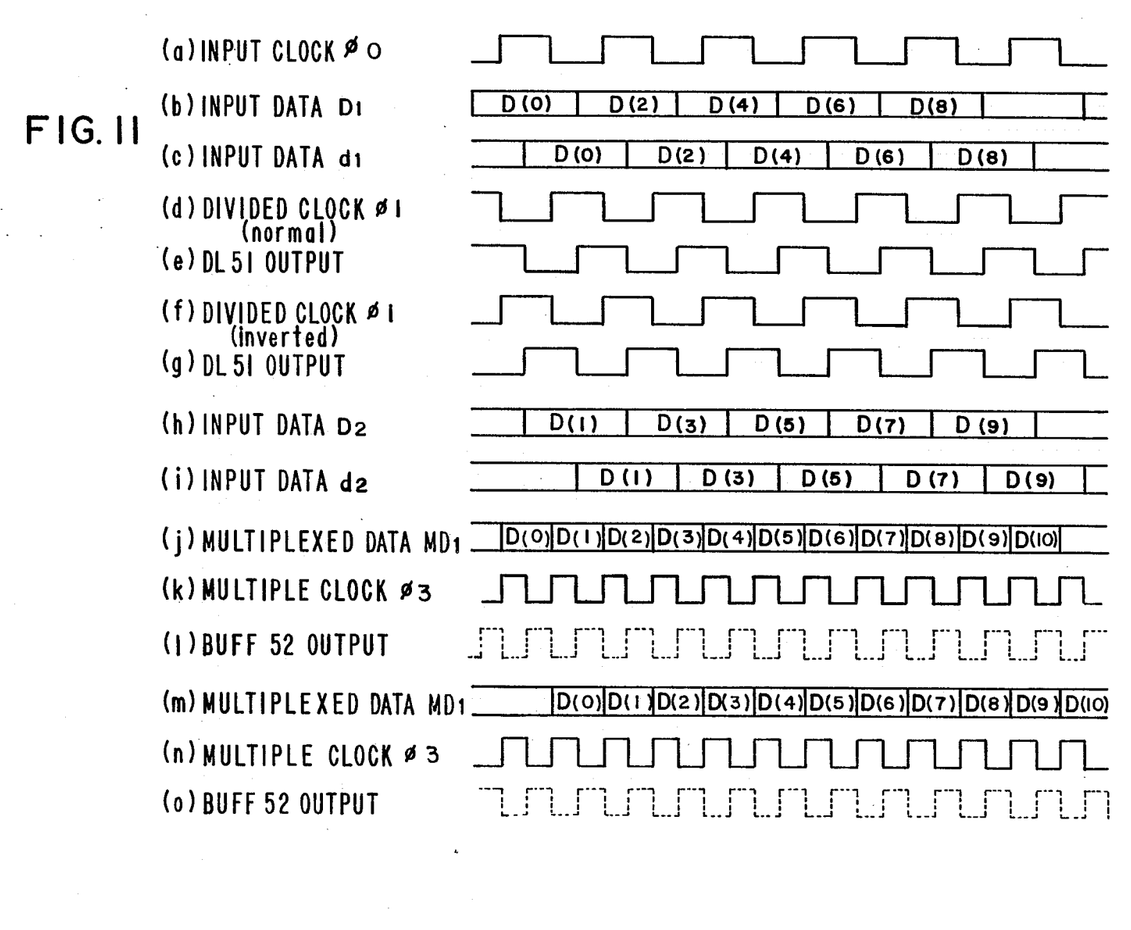
FIG. 11 is a timing chart illustrating signal waveforms at respective points of the circuit diagram of FIG. 10.

The operation of the circuit of FIG. 10 is now described with reference to FIG. 11. FIG. 11 is a timing chart illustrating signal waveforms at respective points of the circuit of FIG. 10.

As described for the converter of FIG. 6 and the respective timing chart of FIG. 7, the input clock $\phi_0$ has previously been adjusted in its phase so that the "H" or "1" level thereof is positioned at the center of input data D1. See FIGS. 11(a) and (b).

This circuit of FIG. 10 includes phase delay circuits 261, 262 for delaying input data D1, D2 with $\pi$ rad respectively. See FIGS. 11(b),(c) and (h), and (i)). That is, the polarities of input data D1, D2 are inverted. A selection circuit 27 selects either one of the input data D1, D2 or delayed data d1, d2 in accordance with selection signals SEL1 and SEL2 from a control circuit 28. A control circuit 28 compares a phase of the clock $\phi_0$ with that of the divided clock $\phi_1$ and controls changeover operation of selection circuit 27 depending on the result of the comparison.

As mentioned previously, the input clock $\phi_0$ is adjusted so that the "H" level thereof is positioned at the center of an input data D1 (FIGS. 11(a) and (b)). This means that the phase of the input clock $\phi_0$ coincides with the phase of the divided clocks $\phi_1$ and $\phi_2$. However, since a control circuit comprises a flip-flop for comparing the phases of the input clock $\phi_0$ and the divided clocks $\phi_1$ and $\phi_2$, this control circuit 28 cannot compare the phases if the phase of the input clock $\phi_0$ coincides with the phase of the divided clocks $\phi_1$ and $\phi_2$, due to the nature of a flip flop. Therefore, the phases of the divided clock $\phi_1$ and $\phi_2$ from divided circuit 34 are adjusted to add $\pi$rad delay by buffer 54 and delay circuit 51(FIGS. 11 (a), (e) or (g)), so that a flip-flop of control circuit 28 can compare the phase relationship between the input clock $\phi_0$ and a divided clock $\phi_1$, that is, between the input data D1 and a divided clock $\phi_1$.

When the phase relationship between the input clock $\phi_0$ and a divided clock $\phi_1$ is normal, as shown in FIGS. 11(a), (d), (e), a selection signal SEL1, which is an output from Q terminal of control circuit 28, is at an "L" level, and a selection signal SEL2, which is an output from Q terminal of control circuit 28, is at an "H" level, so that a selection circuit 27 selects input data D1 and D2 for outputs D40 1 and D'2 (FIGS. 11(b),(h)). Consequently, a multiplexer converts parallel input data D'1 and D''2 into a serial multiplexed data MD1 as shown in FIG. 11(j).

To discriminate a multiplexed data MD1 at the center thereof by a multiple clock $\phi_3$ (FIG. 11(k)), a phase of a multiple clock is adjusted by buffer 52 as shown in FIG. 11(1).

On the other hand, when the phase relationship between the input clock $\phi_0$ and a divided clock $\phi_1$ is in reversed condition, that is, a polarity of a divided clock $\phi_1$ from a divider 34 is inversed as shown in FIG. 11(f), selection signals SEL1 and SEL2 from control circuit 50 turn into "H" and "L" level, respectively. Then selection circuit 27 selects input data d1 and d2 for outputs D'1 and D'2 (FIG. 11(c),(i)). A multiplexer, then converts parallel input data D'1 and D'2 into a serial multiplexed data MD1 as shown in FIG. 11(m). A multiple clock $\phi_3$ is delayed by buffer 52 like FIG. 11(o).

Furthermore, a buffer 53 is just a timing interface to a next circuit and includes a flip-flop.

The embodiments of the converter have been described above as performing parallel-to-serial conversion of two input data. However, the present invention is not limited only to such input data. For example, when there are N parallel input data, a multiplier multiplying input clock frequency by N and a dividing circuit dividing a multiple clock frequency by 1/N can be used instead of the multiplier multiplying input clock frequency by 2 and the dividing circuit dividing a multiple clock frequency by 1/N as shown in FIGS. 3, 4, 6, 8 and 10. It will be apparent to those skilled in the art that modifications and variations could be made to the parallel-to-serial coinverter in accordance with the teachings of the invention without departing from the spirit or scope of the invention. Thus, it is intended that the present invention cover the modifications and variations of the invention within the scope of the claims and their equivalents.

What is claimed is:

1. A parallel-to-serial converter for multiplexing a plurality of parallel input data into a serial data, comprising:
    (a) means for multiplying an input clock by n, wherein n is an iteger greater than or equal to 2, said input clock being in synchronism with one of the plurality of parallel input data and for generating a multiple clock in synchronism with the serial data;
    (b) means for dividing the multiple clock by n and generating a plurality of divided clock signals, each of said plurality of clock signals being in synchronism with one of the plurality of parallel input data;
    (c) means for converting the plurality of parallel input data into a serial data output in reference to a timing of said plurality of divided clock signals from said dividing means;
    (d) means for shaping a waveform of the serial data output from said converting means using the multiple clock from said multiplying means;
    (e) means for comparing a phase relationship between the divided clock signal and the input clock representing a phase of one of the plurality of parallel input data; and
    (f) means for adjusting a phase relationship between the plurality of parallel input data and the plurality of divided clock signals under the control of said comparing means.

2. A parallel-to-serial converter according to claim 1, wherein said adjusting means controls said dividing means so that the phase of said plurality of divided clock signals is adjusted to be in a predetermined relationship with the plurality of parallel input data.

3. A parallel-to-serial converter according to claim 2, wherein said adjusting means inverses polarities of said plurality of divided clock signal.

4. A parallel-to-serial converter according to claim 3 wherein said adjusting means inhibits the multiple clock to be input to said dividing means to inverse a polarity o an output thereof.

5. A parallel-to-serial converter according to claim 1, wherein said adjusting means controls phases of the plurality of parallel input data so that the phases of the plurality of parallel input data are adjusted to be in a predetermined relationship with said plurality of divided clock signals.

6. A parallel-to-serial converter according to claim 1, wherein said comparing means compares phases of said plurality of divided clock signals with phases of the input clock.

* * * * *

UNITED STATES PATENT AND TRADEMARK OFFICE
CERTIFICATE OF CORRECTION

PATENT NO. : 4,965,797

DATED : October 23, 1990

INVENTOR(S) : Kazuo Yamane and Masanori Shimasue

It is certified that error appears in the above-identified patent and that said Letters Patent is hereby corrected as shown below:

Col. 1, line 5, "parallel-toserial" should be --parallel-to-serial--;

line 30, "parallel-toserial" should be --parrell-to-serial--;

Col. 2, line 45, "FIG. 8is" should be --FIG. 8 is--;

line 66, "$\phi 0$" should be --$\phi_0$--;

Col. 3, line 18, "$\phi 3$" should be --$\phi_3$--;

line 27, "D2." should be --$D_2$.--;

line 28, "$\phi 0$" should be --$\phi_0$--;

line 32, "$\phi 1, \phi 2$" should be --$\phi_1, \phi_2$--;

line 45, "$\phi$," should be --$\phi_1$,--;

line 54, "$\overline{\phi_2}$" should be --$\overline{\phi_2}$ having--;

line 63, "parallel-toserial" should be --parallel-to-serial--;

Col. 4, line 2, "D," should be --$D_1$,--;

line 24, after "ing", continue with line 25 beginning the "circuit 34" with no paragraph indentation;

line 25, "$\phi(2)1$~" should be --$\phi(2)_1$~--;

line 37, "MDI" should be --$MD_1$--;

line 38, "MDI" should be --$MD_1$--;

line 44, "$\phi(2)1$~" should be --$\phi(2)_1$~--;

UNITED STATES PATENT AND TRADEMARK OFFICE
CERTIFICATE OF CORRECTION

PATENT NO. : 4,965,797

DATED : October 23, 1990

INVENTOR(S) : Kazuo Yamane and Masanori Shimasue

It is certified that error appears in the above-identified patent and that said Letters Patent is hereby corrected as shown below:

line 47, "$\phi(2)1$~" should be --$\phi(2)_1$---;

line 49, "$\phi(2)1$~" should be --$\phi(2)_1$---;

line 51, "$\phi(2)1$~" should be --$\phi(2)_1$---;

line 53, "D1" should be --$D_1$--;

line 60, "261" should be --$26_1$--;

line 65, "$D'_n$ n" should be --$D'_n$--;

line 67, "$\phi(2)1$~" should be --$\phi(2)_1$---;

Col. 5, line 17, "$\phi(2)1$~" should be --$\phi(2)_1$---;

line 19, "D'1" should be --$D'_1$--;

line 27, "$\phi(2)1$~" should be --$\phi(2)_1$---;

line 31, "$\phi(2)1$~" should be --$\phi(2)_1$---;

line 39, "261" should be --$26_1$--;

line 43, "$\phi(2)1$~" should be --$\phi(2)_1$---;

line 55, "$\phi$1" should be --$\phi_1$--;

line 57, "$\phi$0," should be --$\phi_0$,--;

line 58, "$\phi$1" should be --$\phi_1$--;

line 59, "$\phi$3'" should be --$\phi_3$'--;

line 60, "$\phi$3" should be --$\phi_3$--;

UNITED STATES PATENT AND TRADEMARK OFFICE
CERTIFICATE OF CORRECTION

PATENT NO. : 4,965,797  Page 3 of 7
DATED : October 23, 1990
INVENTOR(S) : Kazuo Yamane and Masanori Shimasue It is certified that error appears in the above-identified patent and that said Letters Patent is hereby corrected as shown below:

line 62, "$\phi 4$" should be --$\phi_4$--;

line 68, "$\phi 0$" should be --$\phi_0$--;

Col. 6, line 1, "$\phi 1, \phi 2$" should be --$\phi_1, \phi_2$--;

line 3, "D1, D2" should be --$D_1, D_2$--;

line 5, "$\phi 0$" should be --$\phi_0$--;

line 7, "D1" should be --$D_1$--;

line 8, "$\phi 1, \phi 2$" should be --$\phi_1, \phi_2$--;

line 9, "$\phi 0$." should be --$\phi_0$.--;

line 11, "$\phi 0$" should be --$\phi_0$--;

line 12, "$\phi 1$" should be --$\phi_1$--;

line 14, "$\phi 4$" should be --$\phi_4$--;

line 15, "Q, Q" should be --Q $\overline{Q}$--;

line 16, "$\phi 0$" should be --$\phi_0$--; and "$\phi 1$" should be --$\phi_1$--;

line 19, "$\phi 1, \phi 2$" should be --$\phi_1, \phi_2$--;

line 20, "$\phi 3$'" should be --$\phi_3$'--;

line 24, "$\phi 1$." should be --$\phi_1$.--;

line 30, "$\phi 1, \phi 2$" should be --$\phi_1, \phi_2$--;

line 40, "$\phi 0$" should be --$\phi_0$--; and "$\phi 1$" should be --$\phi_1$--;

UNITED STATES PATENT AND TRADEMARK OFFICE
CERTIFICATE OF CORRECTION

PATENT NO. : 4,965,797　　　　　　　　　　　　　　　　Page 4 of 7

DATED : October 23, 1990

INVENTOR(S) : Kazuo Yamane and Masanori Shimasue

It is certified that error appears in the above-identified patent and that said Letters Patent is hereby corrected as shown below:

line 42, "$\phi 3'$" should be --$\phi_3'$--;

line 45, "$\phi 5$" should be --$\phi_5$--;

line 49, "$\phi 3$" should be --$\phi_3$--; and "$\phi 6$" should be --$\phi_6$--;

line 54, "$\phi 1$" should be --$\phi_1$--;

line 56, "t1" should be --$t_1$--;

line 57, "$\phi 0$ and" should be --$\phi_1$.--;

line 59, "$\phi 3'$" should be --$\phi_3'$--;

line 63, "$\phi 1, \phi 2$" should be --$\phi_1, \phi_2$--;

line 65, "D1, D2" should be --$D_1, D_2$--;

line 66, "$\phi 1, \phi 2$." should be --$\phi_1, \phi_2$.--;

Col. 7, line 1, "D1, D2" should be --$D_1, D_2$--;

line 2, "(radian)" should be --$\pi$(radian)--;

line 3, "$\phi 1, \phi 2$" should be --$\phi_1, \phi_2$--;

line 4, "$\phi 1, \phi 2$" should be --$\phi_1, \phi_2$--;

line 6, "$\phi 0$." should be --$\phi_0$.--;

line 15, "D1." should be --$D_1$.--;

line 17, "261, 262" should be --$26_1, 26_2$--; and "D1, D2" should be --$D_1, D_2$--;

UNITED STATES PATENT AND TRADEMARK OFFICE
CERTIFICATE OF CORRECTION

PATENT NO. : 4,965,797

DATED : October 23, 1990

INVENTOR(S) : Kazuo Yamane and Masanori Shimasue

It is certified that error appears in the above-identified patent and that said Letters Patent is hereby corrected as shown below:

line 19, "D1, D2" should be --$D_1$, $D_2$--;

line 21, "D1, D2" should be --$D_1$, $D_2$--; and "d1, d2" should be --$d_1$, $d_2$--;

line 22, "SEL1 and SEL2" should be --$SEL_1$ and $SEL_2$--;

line 23, "$\phi0$" should be --$\phi_0$--;

line 24, "$\phi1$" should be --$\phi_1$--;

line 26, "$\phi0$" should be --$\phi_0$--;

line 28, "D1" should be --$D_1$--;

line 29, "$\phi0$" should be --$\phi_0$--;

line 30, "$\phi1$ and $\phi2$" should be --$\phi_1$ and $\phi_2$--;

line 32, "$\phi0$" should be --$\phi_0$--;

line 33, "$\phi$ and $\phi2$" should be --$\phi_1$ and $\phi_2$--;

line 34, "$\phi0$" should be --$\phi_0$--;

line 35, "$\phi1$" should be --$\phi_1$--;

line 36, "$\phi2$," should be --$\phi_2$,--;

line 37, "$\phi1$ and $\phi2$" should be --$\phi_1$ and $\phi_2$--;

line 39, "51(FIGS." should be --"51 (FIGS.--;

line 41, "$\phi0$" should be --$\phi_0$--; and "$\phi1$," should be --$\phi_1$,--;

line 42, "D1" should be --$D_1$--; and "$\phi1$." should be --$\phi_1$.--;

UNITED STATES PATENT AND TRADEMARK OFFICE
CERTIFICATE OF CORRECTION

PATENT NO. : 4,965,797

DATED : October 23, 1990

INVENTOR(S) : Kazuo Yamane and Masanori Shimasue

Page 6 of 7

It is certified that error appears in the above-identified patent and that said Letters Patent is hereby corrected as shown below:

line 44, "$\phi 0$" should be --$\phi_0$--; and "$\phi 1$" should be --$\phi_1$--;

line 45, "SEL1" should be --$SEL_1$--;

line 48, "Q" should be --$\overline{Q}$--;

line 49, "D1" should be --$D_1$--;

line 50, "D2" should be --$D_2$--; and "D40 1 and D'2" should be --$D'_1$ and $D'_2$ --;

line 51, "D'1" should be --$D'_1$--;

line 52, "D''" should be --$D'_2$--; and "MD1" should be --$MD_1$--;

line 54, "MD1" should be --$MD_1$--;

line 55, "$\phi 3$" should be --$\phi_3$--;

line 59, "$\phi 1$" should be --$\phi_1$--;

line 61, "$\phi 1$" should be --$\phi_1$--;

line 62, "SEL1 and SEL2" should be --$SEL_1$ and $SEL_2$--;

line 64, "d1 and d2" should be --$d_1$ and $d_2$--;

line 65, "D'1 and D'2" should be --$D'_1$ and $D'_2$--;

line 66, "D'1 and D'2" should be --$D'_1$ and $D'_2$--;

line 67, "MD1" should be --$MD_1$--;

line 68, "$\phi 3$" should be --$\phi_3$--;

UNITED STATES PATENT AND TRADEMARK OFFICE
CERTIFICATE OF CORRECTION

PATENT NO. : 4,965,797

DATED : October 23, 1990

INVENTOR(S) : Kazuo Yamane and Masanori Shimasue

It is certified that error appears in the above-identified patent and that said Letters Patent is hereby corrected as shown below:

Col. 8, Line 14, "coinverter" should be --converter--;

line 25, "iteger" should be --integer--; and line 58, "o an" should be --of an--.

Signed and Sealed this

Ninth Day of June, 1992

*Attest:*

DOUGLAS B. COMER

*Attesting Officer*    *Acting Commissioner of Patents and Trademarks*